(12) United States Patent
Pan et al.

(10) Patent No.: US 8,148,827 B2
(45) Date of Patent: Apr. 3, 2012

(54) QUAD FLAT NO LEAD (QFN) PACKAGE

(75) Inventors: Yu-Tang Pan, Hsinchu (TW); Shih-Wen Chou, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 134 days.

(21) Appl. No.: 12/832,223

(22) Filed: Jul. 8, 2010

(65) Prior Publication Data

US 2011/0156281 A1  Jun. 30, 2011

(30) Foreign Application Priority Data

Dec. 31, 2009  (TW) ................................ 98146106 A

(51) Int. Cl.
*H01L 23/49* (2006.01)
(52) U.S. Cl. ....................................................... 257/782
(58) Field of Classification Search .................. 257/782, 257/788, 784, E23.023, E23.24
See application file for complete search history.

(56) References Cited

U.S. PATENT DOCUMENTS 6,414,385 B1 * 7/2002 Huang et al. .................. 257/690
7,851,896 B2 * 12/2010 Shen et al. .................... 257/668

\* cited by examiner

*Primary Examiner* — Thao P. Le
(74) *Attorney, Agent, or Firm* — WPAT, P.C.; Anthony King

(57) ABSTRACT

The present invention relates to a quad flat no lead (QFN) package is provided. In the invention, a plurality of first pads are disposed outside an extension area of a conductive circuit layer, and a plurality of second pads are disposed inside a die bonding area of the conductive circuit layer, wherein the extension area surrounds the die bonding area. First ends of a plurality of traces are connected to the second pads, and second ends of the traces are located in the extension area. An insulating layer fills at least the die bonding area and the extension area, and exposes top surfaces and bottom surfaces of the second pads. A chip is mounted at the die bonding area and a plurality of wires electrically connect the chip to the first pads and the second ends of the traces respectively. An encapsulation material is used to cover the conductive circuit layer, the chip and the wires. Whereby, the package of the invention can have more inputs/outputs terminals, and the insulating layer can prevent moisture permeation from corroding the joints between the wires and the first pads and the second ends of the traces, thus increasing the reliability of the package of the invention.

9 Claims, 7 Drawing Sheets

QUAD FLAT NO LEAD (QFN) PACKAGE

BACKGROUND OF THE INVENTION

1. Field of the Invention

The present invention relates to a package, and more particularly, to a quad flat no lead (QFN) package.

2. Description of the Related Art

FIG. 1 is a schematic view of a conventional QFN package. As shown in FIG. 1, the conventional package 100 comprises a die pad 101, a chip 102, a plurality of pads 103, a plurality of wires 104 and an encapsulation material 105. The chip 102 is mounted on the die pad 101. The pads 103 circumvent the die pad 101. The chip 102 is electrically connected to the pads 103 through the wires 104. The encapsulation material 105 covers the die pad 101, the chip 102, the pads 103 and the wires 104, wherein the bottom surface of the die pad 101 and the bottom surfaces of the pads 103 are exposed, and the exposed bottom surfaces of the pads 103 serve as external terminals.

Uncovering of the bottom surfaces of the die pad 101 and the pads 103 by the encapsulation material 105 exposes the bottom surfaces of the die pad 101 and the pads 103 to the air. The joints between the wires 104 and the pads 103 which are closer to the outside environment are likely to be damaged, thus decreasing the reliability of the conventional package 100, since the encapsulation material 105 tends to absorb moisture. Additionally, since the pads 103 circumvent the die pad 101, the amount of inputs/outputs terminals is limited in the conventional package 100 with a fixed size. If the amount of inputs/outputs terminals is intentionally increased in the conventional package 100, the amount of the pads 103 circumventing the die pad 101 must be increased, thus the size of the conventional package 100 must be enlarged.

Consequently, there is an existing need for a quad flat no lead package that solves the above-mentioned problems.

SUMMARY OF THE INVENTION

The present invention provides a quad flat no lead (QFN) package. The QFN package comprises a conductive circuit layer, a chip, a plurality of wires and an encapsulation material. The conductive circuit layer has a die bonding area, an extension area, a plurality of first pads, a plurality of second pads, a plurality of traces and an insulating layer. The extension area surrounds the die bonding area. The first pads are disposed outside the extension area. The second pads are disposed inside the die bonding area. Each of the traces has a first end and a second end, wherein the first ends of the traces are connected to the second pads, and the second ends of the traces are terminated in the extension area. The insulating layer fills at least the die bonding area and the extension area, and exposes top surfaces and bottom surfaces of the second pads. The chip is mounted at the die bonding area. The wires electrically connect the chip to the first pads and the second ends of the traces, respectively. The encapsulation material covers the conductive circuit layer, the chip and the wires.

In the package of the present invention, an insulating layer (such as solder mask material, polyimide or benzocyclobutene) is partially or entirely disposed on the bottom surface of the package, a plurality of second pads disposed in the die bonding area are redistributed by traces each connecting a corresponding second pad at a first end and terminating inside the extension area at a second end or at a third pad. A chip is then electrically connected to the second ends of the traces or the third pads through wires, so as to form signal transmission paths between the chip and the second pads underneath the chip. With the exposed bottom surfaces of the second pads serving as external connecting terminals, the package of the invention can have more inputs/outputs terminals. Furthermore, the insulating layer disposed on the bottom surface of the package has low moisture absorbing ability and can prevent moisture permeation from corroding the joints between the wires and the pads, thus increasing the reliability of the package of the invention.

DETAILED DESCRIPTION OF THE INVENTION

Figure 1:
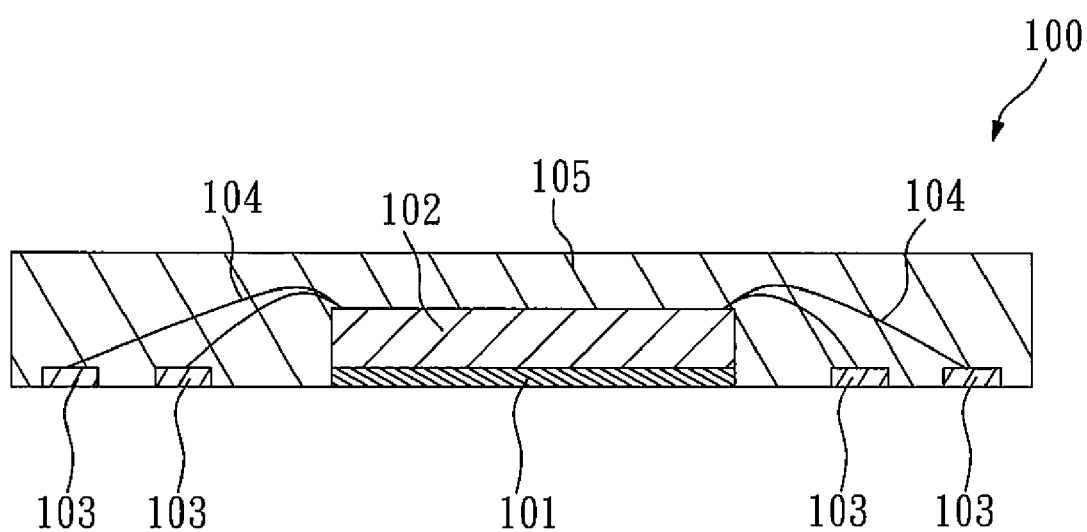
FIG. 1 is a schematic view of a conventional package.
Figure 2A:
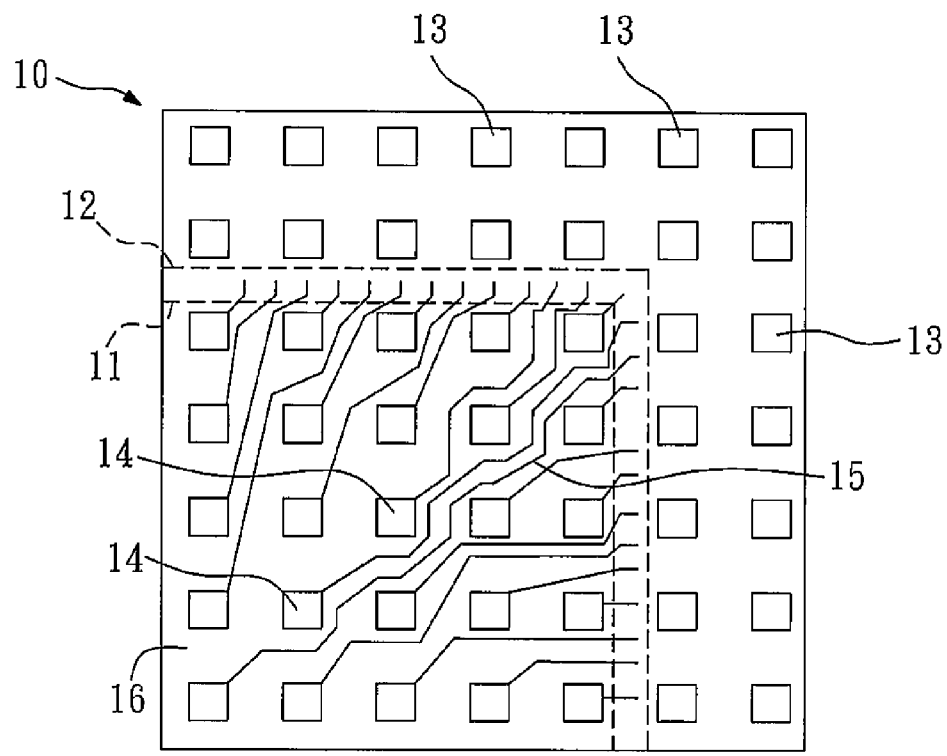
FIG. 2A is a partial schematic view of the distribution of a conductive circuit layer of a QFN package according to a first embodiment of the present invention.
Figure 2B:
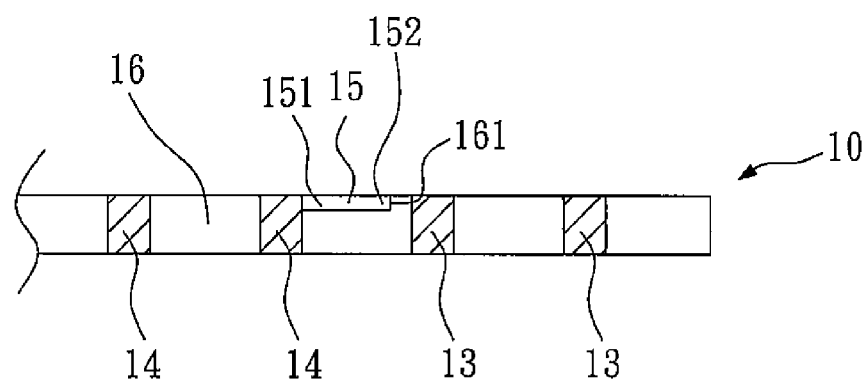
FIG. 2B is a partial cross-sectional view of FIG. 2A.
Figure 3:
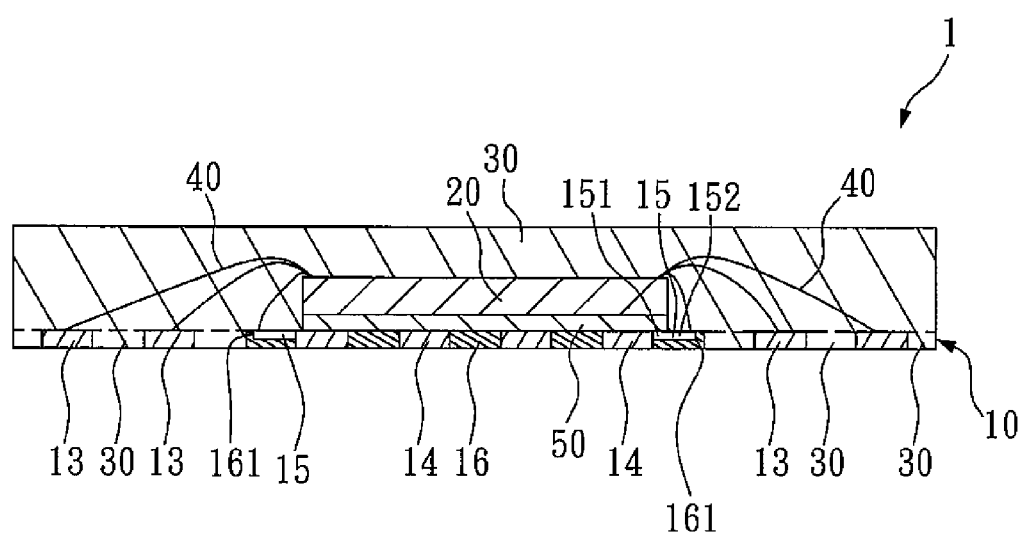
FIG. 3 is a schematic view of the QFN package according to the first embodiment of the present invention.

FIG. 2A is a partial schematic view of the distribution of a conductive circuit layer of a QFN package according to a first embodiment of the present invention; FIG. 2B is a partial cross-sectional view of FIG. 2A; FIG. 3 is a schematic view of the QFN package according to the first embodiment of the present invention. As shown in FIGS. 2A, 2B and 3, the QFN package 1 comprises a conductive circuit layer 10, a chip 20, a plurality of wires 40 and an encapsulation material 30.

The conductive circuit layer 10 has a die bonding area 11, an extension area 12, a plurality of first pads 13, a plurality of second pads 14, a plurality of traces 15 and an insulating layer 16. The extension area 12 surrounds the die bonding area 11. The first pads 13 are disposed outside the extension area 12. The second pads 14 are disposed inside the die bonding area 11. Each of the traces 15 has a first end 151 and a second end 152, wherein the first ends 151 of the traces 15 are connected to the second pads 14, and the second ends 152 of the traces 15 are terminated in the extension area 12. The insulating layer 16 fills at least the die bonding area 11 and the extension area 12, and exposes top surfaces and bottom surfaces of the second pads 14. In this embodiment, the insulating layer 16 fills only the die bonding area 11 and the extension area 12 but does not fill the areas outside the extension area 12.

The insulating layer 16 can be made of solder mask material, polyimide (PI) or benzocyclobutene (BCB). In this embodiment, the insulating layer 16 further comprises a plurality of grooves 161. Each of the grooves 161 partially penetrates the insulating layer 16 and extends from a corresponding second pad 14 to terminate within the extension area 12.

The traces 15 are disposed in the grooves 161, and the first ends 151 of the traces 15 are connected to the corresponding second pads 14.

In this embodiment, the chip 20 is mounted at the die bonding area 11 through an adhesive layer 50, and the wires 40 electrically connect the chip 20 to the first pads 13 and the second ends 152 of the traces 15, respectively. The encapsulation material 30 covers the conductive circuit layer 10, the chip 20 and the wires 40, and the QFN package 1 according to the first embodiment of the present invention is made.

Figure 4A:
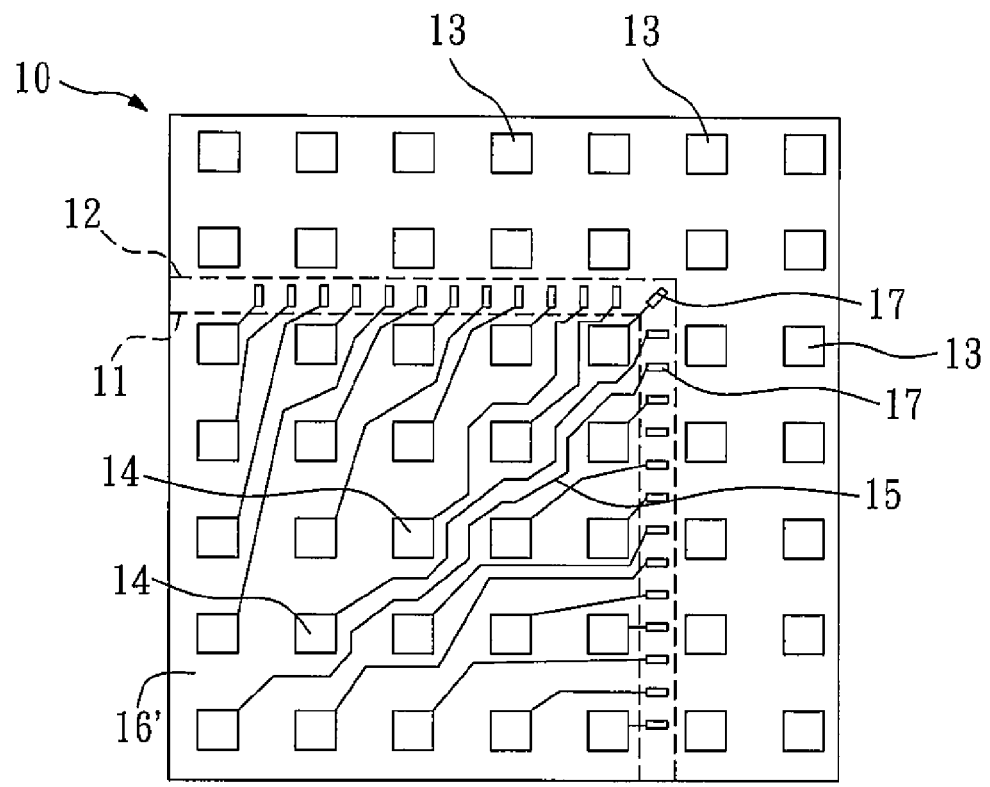
FIG. 4A is a partial schematic view of the distribution of another type of conductive circuit layer of a QFN package according to the first embodiment of the present invention.
Figure 4B:
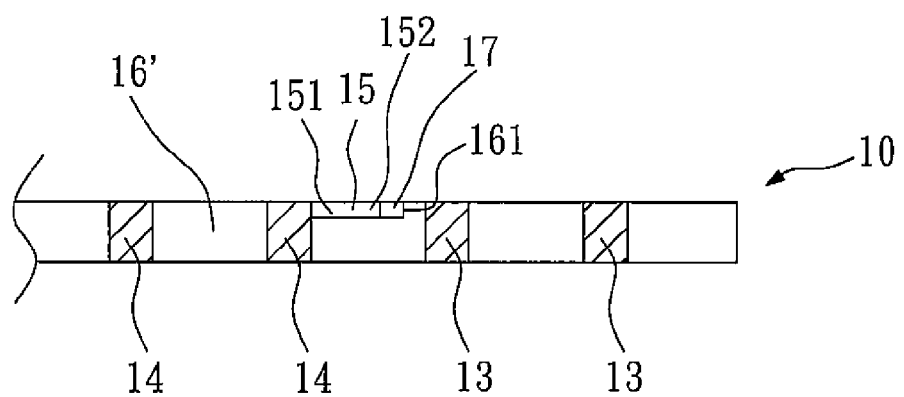
FIG. 4B is a partial cross-sectional view of FIG. 4A.
Figure 5:
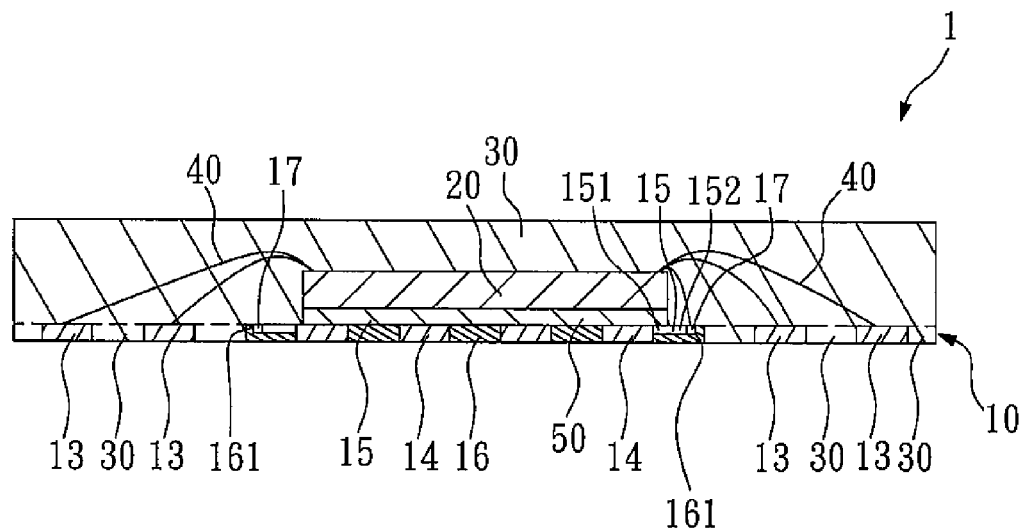
FIG. 5 is a schematic view of a QFN package comprising the conductive circuit layer in FIGS. 4A and 4B according to the present invention.

FIG. 4A is a partial schematic view of the distribution of another type of conductive circuit layer of a QFN package according to the first embodiment of the present invention; and FIG. 4B is a partial cross-sectional view of FIG. 4A. As shown in FIGS. 4A and 4B, the conductive circuit layer 10 can further comprises a plurality of third pads 17 that are disposed in the grooves 161 and located in the extension area 12. The second ends 152 of the traces 15 are connected to the third pads 17, the chip 20 is electrically connected to the first pads 13 and the third pads 17 through the wires 40, and a QFN package 1 as shown in FIG. 5 is made. It should be noted that the third pads 17 can be parts of the traces 15.

Figure 6:
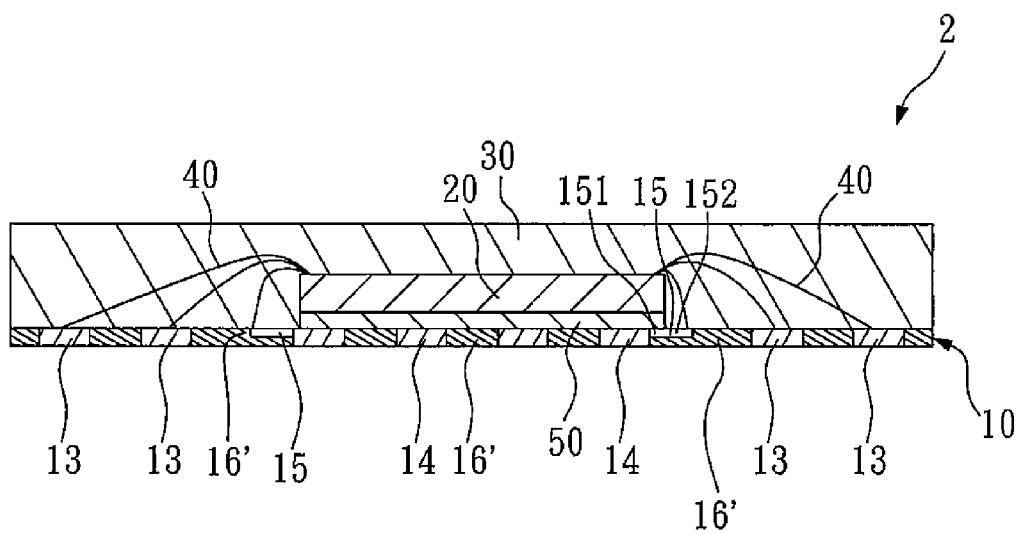
FIG. 6 is a schematic view of a QFN package according to a second embodiment of the present invention.

FIG. 6 is a schematic view of a QFN package according to a second embodiment of the present invention. As shown in FIG. 6, the QFN package 2 of the second embodiment is substantially similar to the QFN package 1 (FIG. 3) of the first embodiment. The difference between the second embodiment and the first embodiment lies in the insulating layer 16'. In this embodiment, the insulating layer 16' fills all of the areas between the first pads 13, the second pads 14 and the traces 15, and exposes the top surfaces and the bottom surfaces of the first pads 13 and the second pads 14. The same elements in the second embodiment and the first embodiment are designated with the same numerals and therefore not described in detail here.

However, it should be noted that in other embodiments, the conductive circuit layer 10 as shown in FIGS. 4A and 4B may be applied, and the insulating layer 16' fills all of the areas between the first pads 13, the second pads 14, the third pads 17 and the traces 15, and exposes the top surfaces and the bottom surfaces of the first pads 13 and the second pads 14.

Figure 7A:
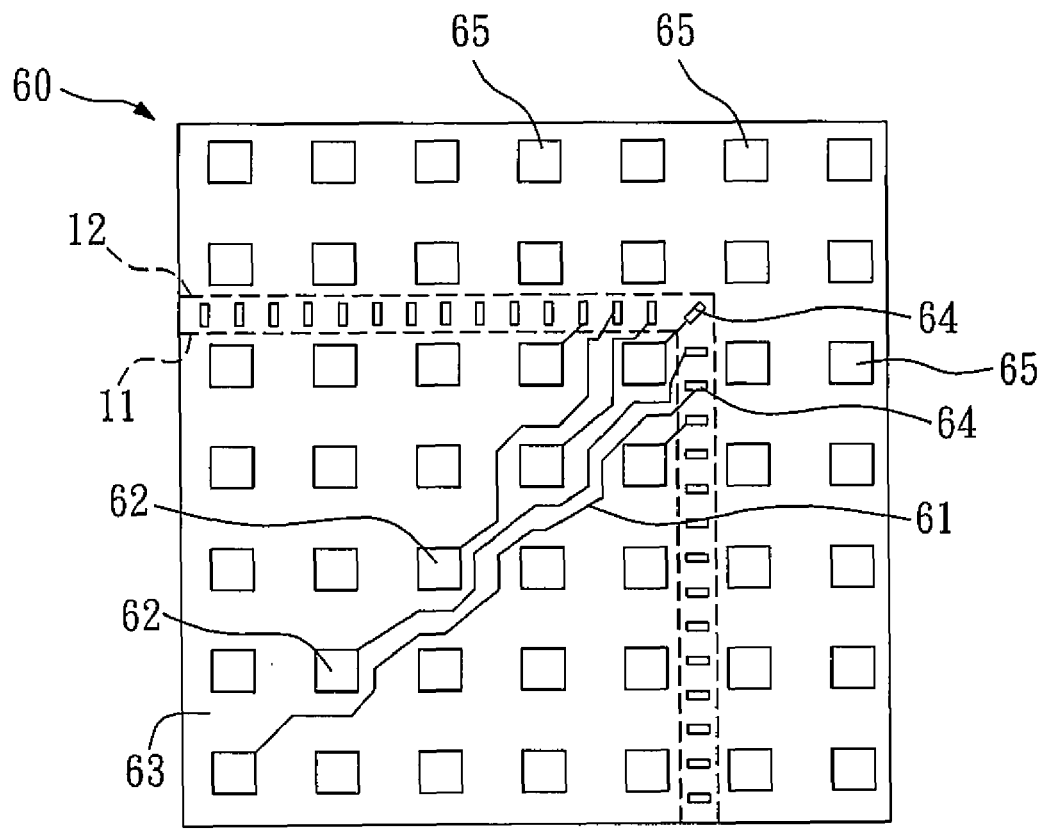
FIG. 7A is a partial schematic view of the distribution of a conductive circuit layer of a QFN package according to a third embodiment of the present invention.
Figure 7B:
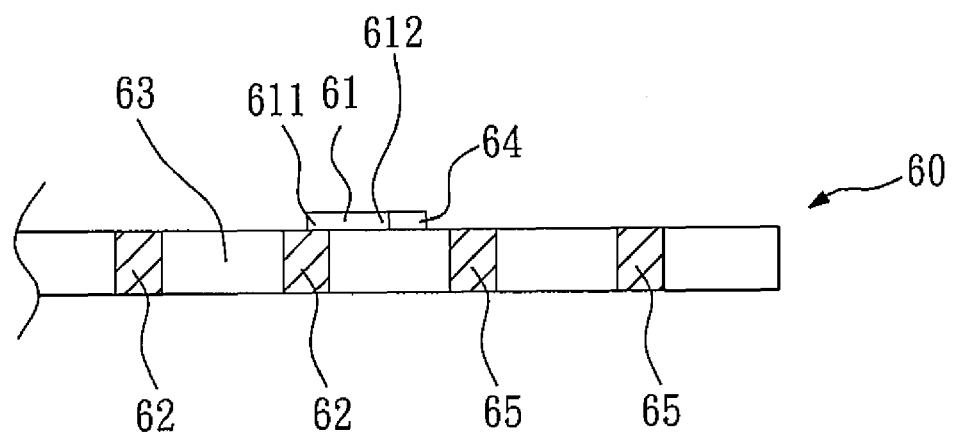
FIG. 7B is a partial cross-sectional view of FIG. 7A.
Figure 8:
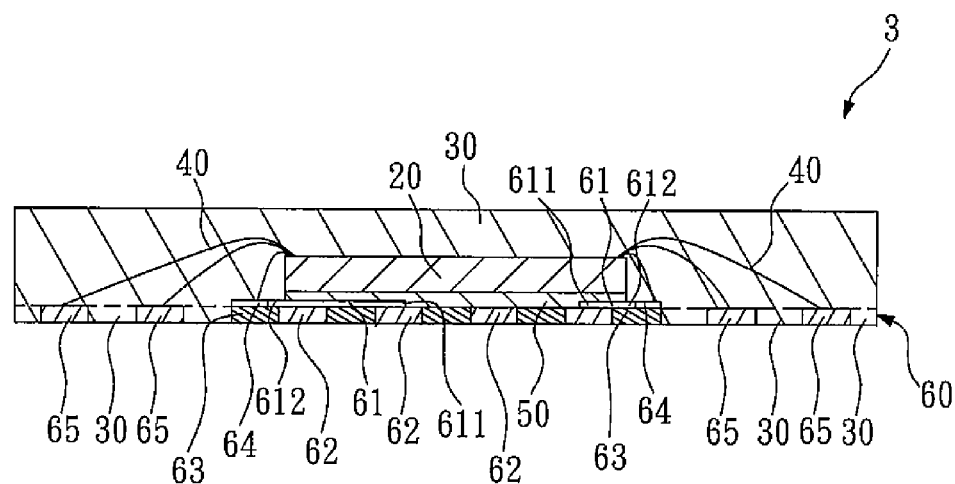
FIG. 8 is a schematic view of the QFN package according to the third embodiment of the present invention.

FIG. 7A is a partial schematic view of the distribution of a conductive circuit layer of a QFN package according to a third embodiment of the present invention, FIG. 7B is a partial cross-sectional view of FIG. 7A, and FIG. 8 is a schematic view of the QFN package according to the third embodiment of the present invention. As shown in FIGS. 7A, 7B and 8, in this embodiment, the QFN package 3 is substantially similar to the QFN package 1 as shown in FIG. 5. The difference between the two embodiments lies in the conductive circuit layer 60.

In this embodiment, the traces 61 of the conductive circuit layer 60 are disposed upon the second pads 62 and the insulating layer 63. A plurality of third pads 64 of the conductive circuit layer 60 are disposed upon the insulating layer 63 and located in the extension area 12. First ends 611 of the traces 61 are connected to the second pads 62, and second ends 612 of the traces 61 are connected to the third pads 64. The insulating layer 63 fills the die bonding area 11 and the extension area 12, and exposes the top surfaces and the bottom surfaces of the second pads 62. The same elements in this embodiment are designated with the same numerals as those of the QFN package 1 in FIG. 5 and therefore not described in detail here.

Figure 9:
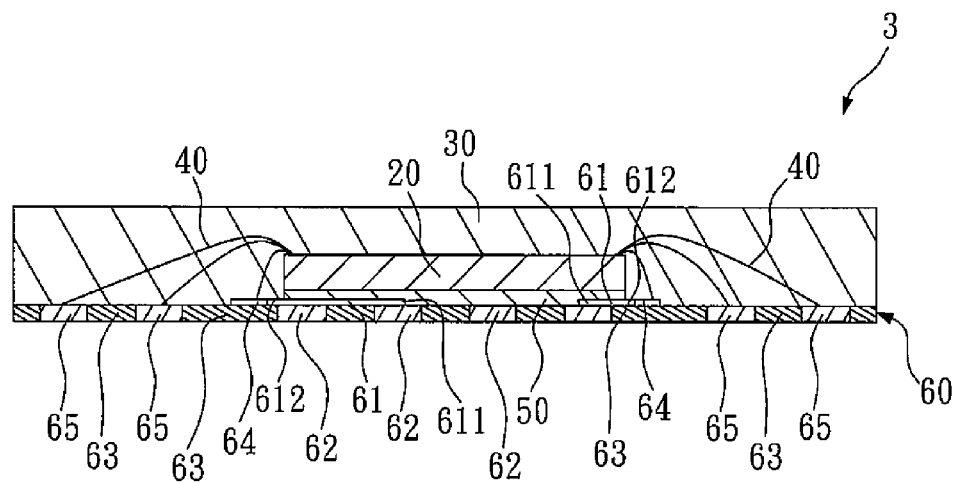
FIG. 9 is a schematic view of another type of QFN package according to the third embodiment of the present invention.

However, it should be noted that in other embodiments, the insulating layer 63 can fill all of the areas between first pads 65 of the conductive circuit layer 60 and the second pads 62, and expose the top surfaces and the bottom surfaces of the first pads 65 and the second pads 62, and the QFN package 3 as shown in FIG. 9 is made.

In the package of the present invention, an insulating layer (such as solder mask material, polyimide or benzocyclobutene) is partially or entirely disposed on the bottom surface of the package, a plurality of second pads disposed in the die bonding area are redistributed by traces each connecting a corresponding second pad at a first end and terminating inside the extension area at a second end or at a third pad. A chip is then electrically connected to the second ends of the traces or the third pads through wires, so as to form signal transmission paths between the chip and the second pads underneath the chip. With the exposed bottom surfaces of the second pads serving as external connecting terminals, the package of the invention can have more inputs/outputs terminals.

Furthermore, the insulating layer disposed on the bottom surface of the package has low moisture absorbing ability and can prevent moisture permeation from corroding the joints between the wires and the first and third pads, thus increasing the reliability of the package of the invention.

While embodiments of the present invention have been illustrated and described, various modifications and improvements can be made by those skilled in the art. The embodiments of the present invention are therefore described in an illustrative but not restrictive sense. It is intended that the present invention is not limited to the particular forms illustrated, and that all modifications that maintain the spirit and scope of the present invention are within the scope defined in the appended claims.

What is claimed is:

1. A quad flat no lead (QFN) package, comprising:
   a conductive circuit layer, having a die bonding area, an extension area, a plurality of first pads, a plurality of second pads, a plurality of traces and an insulating layer, wherein the extension area surrounds the die bonding area, the first pads are disposed outside the extension area, the second pads are disposed inside the die bonding area, each of the traces has a first end and a second end, the first ends of the traces are connected to the second pads, the second ends of the traces are terminated in the extension area, the insulating layer fills at least the die bonding area and the extension area and exposes top surfaces and bottom surfaces of the second pads;
   a chip, mounted at the die bonding area;
   a plurality of wires, electrically connecting the chip to the first pads and the second ends of the traces, respectively; and
   an encapsulation material, covering the conductive circuit layer, the chip and the wires.

2. The QFN package according to claim 1, wherein the traces are disposed upon the second pads and the insulating layer.

3. The QFN package according to claim 2, wherein the conductive circuit layer further comprises a plurality of third pads that are disposed upon the insulating layer and located in the extension area, the second ends of the traces are connected to the third pads, and the wires electrically connect the chip to the first pads and the third pads, respectively.

4. The QFN package according to claim 3, wherein the insulating layer fills all of the areas between the first pads and the second pads, and exposes top surfaces and bottom surfaces of the first pads and the second pads.

5. The QFN package according to claim 1, wherein the insulating layer further comprises a plurality of grooves, each of the grooves partially penetrates the insulating layer and extends from a corresponding second pad to terminate within the extension area, the traces are disposed in the grooves, and the first ends of the traces are connected to the corresponding second pads.

6. The QFN package according to claim 5, wherein the conductive circuit layer further comprises a plurality of third pads that are disposed in the grooves and located in the extension area, the second ends of the traces are connected to the third pads, and the wires electrically connect the chip to the first pads and the third pads, respectively.

7. The QFN package according to claim 6, wherein the insulating layer fills all of the areas between the first pads, the second pads, the third pads and the traces, and exposes top surfaces and bottom surfaces of the first pads and the second pads.

8. The QFN package according to claim 1, wherein the insulating layer is made of solder mask material, polyimide (PI) or benzocyclobutene (BCB).

9. The QFN package according to claim 1, further comprising an adhesive layer disposed between the conductive circuit layer and the chip.

* * * * *